United States Patent
Kawakami et al.

(10) Patent No.: US 7,807,991 B2
(45) Date of Patent: Oct. 5, 2010

(54) SWITCHING ELEMENT

(75) Inventors: Haruo Kawakami, Tokyo (JP); Keisuke Yamashiro, Tokyo (JP); Hisato Kato, Tokyo (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 930 days.

(21) Appl. No.: 10/558,259

(22) PCT Filed: Aug. 12, 2004

(86) PCT No.: PCT/JP2004/011604
§ 371 (c)(1),
(2), (4) Date: Jan. 19, 2007

(87) PCT Pub. No.: WO2005/018009
PCT Pub. Date: Feb. 24, 2005

(65) Prior Publication Data
US 2007/0172697 A1    Jul. 26, 2007

(30) Foreign Application Priority Data
Aug. 19, 2003   (JP)   ............... 2003-295146

(51) Int. Cl.
H01L 45/00      (2006.01)
H01L 51/30      (2006.01)
(52) U.S. Cl. .......... 257/40; 257/E45.002; 257/E51.025; 438/99
(58) Field of Classification Search ............ 257/40, 257/E45.002, E51.043, E51.025, E51.003, 257/E51.008, 1, 2, 3, 4; 438/99; 365/148
See application file for complete search history.

(56) References Cited

U.S. PATENT DOCUMENTS 6,987,689 B2 * 1/2006 Bozano et al. ............... 365/148
7,227,178 B2 * 6/2007 Kawakami et al. ............ 257/40

FOREIGN PATENT DOCUMENTS

| EP | 1 598 877 | 11/2005 |
| JP | 2000-012922 | 1/2000 |
| JP | 2003-228185 | 8/2003 |
| JP | 2003-238561 | 8/2003 |
| WO | WO 02/37500 | 5/2002 |

OTHER PUBLICATIONS

Adachi, et al., Oyo Butsuri Gakkai Yokoshu, Mar. 2002, Third Issue, 27a-M-5, p. 1236 (Japanese; English-language translation).

(Continued)

Primary Examiner—Victor A Mandala
Assistant Examiner—Scott Stowe
(74) Attorney, Agent, or Firm—Rabin & Berdo, P.C.

(57) ABSTRACT

A switching element with bistable characteristics which has switching characteristics stabilized by raising transition probability. The switching element has an organic bistable material layer between at least two electrodes. The organic bistable material layer contains an organic bistable compound having two stable resistance values to an applied voltage, wherein the switching element has thin films of a first electrode layer, a metal microparticle-containing layer, the organic bistable material layer, and a second electrode layer, formed on a substrate in this order, and the metal microparticle-containing layer contains metal microparticle and the organic bistable compound.

15 Claims, 5 Drawing Sheets

OTHER PUBLICATIONS

Kumai, et al., Kotai Butsuri, 35 (2000), p. 35 (Japanese; English-language translation).

R. S. Potember et al. "Electrical switching and memory phenomena in Cu-TCNQ thin films" Appl. Phys. Lett., 34 (1979), p. 405-407.

Tsujioka Tsuyoshi et al: "Organic bistable molecular memory using photochromic diarylethene" Applied Physics Letters, AIP, American Institute of Physics, Melville, NY, US, vol. 83, No. 5, Aug. 4, 2003, pp. 937-939.

* cited by examiner

SWITCHING ELEMENT

BACKGROUND OF THE INVENTION

1. Technical Field

The present invention relates to a switching element for driving display panels using organic electroluminescent (EL) elements, liquid crystals, etc., and a switching element for high-density memories, etc.

2. Background Art

Remarkable progress recently has been made in properties of organic electronic materials. Particularly so-called organic bistable materials, which show switching behavior such that the circuit current is rapidly increased at a certain applied voltage, have been studied with respect to the application to a switching element for driving organic EL display panels, a high-density memory, etc.

FIG. 5 shows an example of current-voltage characteristics of an organic bistable material, which displays the above switching behavior.

As shown in FIG. 5, the organic bistable material has two current-voltage characteristics: (1) a high resistance property 51 (off state) and (2) a low resistance property 52 (on state), and has such a nonlinear response property that under a bias Vb, an applied voltage of Vth2 or more causes transition from the off state to the on state and an applied voltage of Vth1 or less (Vth1<Vth2) causes transition from the on state to the off state to change the resistance value. Thus, by applying a voltage of at least Vth2 or at most Vth1 to the organic bistable material, a so-called switching operation can be carried out. The voltages of Vth1 and Vth2 may be applied as pulse voltages.

Various organic complexes are known as organic bistable materials showing the nonlinear response. For example, R. S. Potember, et al. have experimentally produced a switching element that uses a Cu-TCNQ (copper-tetracyanoquinodimethane) complex to obtain two stable resistance values corresponding to voltage (see R. S. Potember, et al., *Appl. Phys. Lett.*, 34 (1979), 405).

Further, Kumai, et al. have used a single crystal of a K-TCNQ (potassium-tetracyanoquinodimethane) complex to observe a switching behavior due to a nonlinear response (see Kumai, et al., *Kotai Butsuri*, 35 (2000), 35).

Furthermore, Adachi, et al. have formed a Cu-TCNQ complex thin film by using a vacuum deposition method to clarify its switching characteristics, and have studied its applicability to organic EL matrixes (see Adachi, et al., *Oyo Butsuri Gakkai Yokoshu*, Spring 2002, Third issue, 1236).

However, switching elements using the above-mentioned organic charge transfer complexes have the following disadvantages.

The switching elements have poor repeatability of their switching behaviors. That is, all the elements do not display the switching characteristics even if they are produced under the same production conditions. Thus, the switching elements are disadvantageous in their lower switching or transition probability.

Though causes of the unevenness have not been clarified, the following reasons are possible. In the transition from the off state to the on state shown in FIG. 5, a charge must be injected from a metal electrode to an organic film. The interface between the organic material film and the metal electrode has microscopic roughness, and it is thought that, in the transition from the off to the on state, the charge is injected into the organic material film due to electrostatic focusing in the rough portion. While the roughness of the interface depends on the flatness of the electrode and the organic material film, it is difficult to control the microscopic roughness, so that the transition voltage is inevitably uneven.

OBJECT AND SUMMARY OF THE INVENTION

In view of the problems of the above-described prior art, an object of the present invention is to provide a switching element that includes an organic bistable material between electrodes, which has stabilized switching characteristics with a high switching ratio (a high transition probability)

Thus, the switching element of the present invention includes an organic bistable material layer between at least two electrodes, the organic bistable material layer containing an organic bistable compound having two stable resistance values to an applied voltage. The switching element comprises in order a thin film first electrode layer, a thin film metal microparticle-containing layer, a thin film of the organic bistable material layer, and a thin film second electrode layer. The metal microparticle-containing layer contains metal microparticles and the organic bistable compound.

In the switching element of the invention, the metal microparticle-containing layer, which is formed by adding the metal microparticles into the organic bistable material, is disposed between the first electrode layer and the organic bistable material layer, as a result of which an energy barrier to charge injection from the first electrode to the metal microparticle dispersion layer can be lowered by the metal microparticles. Thus, interference by the energy barrier with the charge injection can be removed, so that the transition probability can be increased by the removal and also by the electrostatic focusing effect of the metal microparticles.

According to the invention, it is preferred that a charge is injected from the first electrode layer through the metal microparticle-containing layer to the organic bistable material layer, and that the metal microparticle-containing layer has an energy barrier to the first electrode layer lower than that of the organic bistable material layer.

In this embodiment, the energy barrier of the metal microparticle-containing layer to the first electrode layer is lower than that of the organic bistable material layer to the first electrode layer. Thus, the charge easily can be injected from the first electrode layer to the organic bistable material layer to increase the transition probability of the element.

According to the invention, it is preferred that the metal microparticle-containing layer is formed by codepositing a metal and the organic bistable compound. In this embodiment, nano-size metal microparticles easily can be formed by deposition, and the metal microparticles and the organic bistable compound can be codeposited into a uniform layer, whereby the transition probability of the element can be further increased.

According to another preferred embodiment of the invention, the metal microparticle-containing layer is formed by applying a solution containing the metal microparticles and the organic bistable compound. The metal microparticles and the organic bistable compound can be formed to a uniform layer, whereby the transition probability of the element can be further increased.

In the invention, it is preferred that the organic bistable compound is a compound represented by the following structural formula (I).

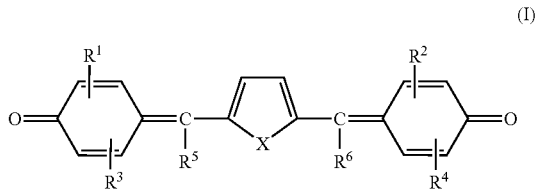

(I)

In the formula (I), $R^1$ to $R^4$ each represent a hydrogen atom, an alkyl group having 1 to 6 carbon atoms which may have a substituent, or an aryl group which may have a substituent, and $R^1$ to $R^4$ may be the same or may be different. $R^5$ and $R^6$ each represent a hydrogen atom, an alkyl group having 1 to 6 carbon atoms which may have a substituent, an aryl group which may have a substituent, or a heterocycle which may have a substituent, and $R^5$ and $R^6$ may be the same or may be different. X represents oxygen or sulfur.

In this embodiment, an electron easily can be injected into the above quinomethane-based compound from the first electrode because the compound has a low LUMO (lowest unoccupied molecular orbit) level, and the compound exhibits an electron transport property and excellent bistability to be suitable for the invention because the compound has a quinone group of an electron-accepting functional group.

Further, according to the invention, in a case where the organic bistable compound is represented by the structural formula (I), the first electrode layer preferably comprises aluminum and the second electrode preferably comprises gold. In this embodiment, because aluminum is an electrode material having a lower absolute work function value that easily releases an electron, and gold is an electrode material having a higher absolute work function value that resists release of an electron, the combination thereof preferably can be used in the electrodes of the invention to achieve the charge injection with ease.

Furthermore, according to the invention, in a case where the organic bistable compound is represented by the structural formula (I), the metal microparticles preferably comprise aluminum. In this embodiment, aluminum is preferable because it exhibits an electron-releasing property in the compound of the structural formula (I) and acts to reduce the relative energy level.

Thus, according to the present invention, in a switching element that includes an organic bistable material between electrodes, the transition probability can be increased to stabilize the switching characteristics.

DETAILED DESCRIPTION OF THE PREFERRED EMBODIMENTS

Figure 1:
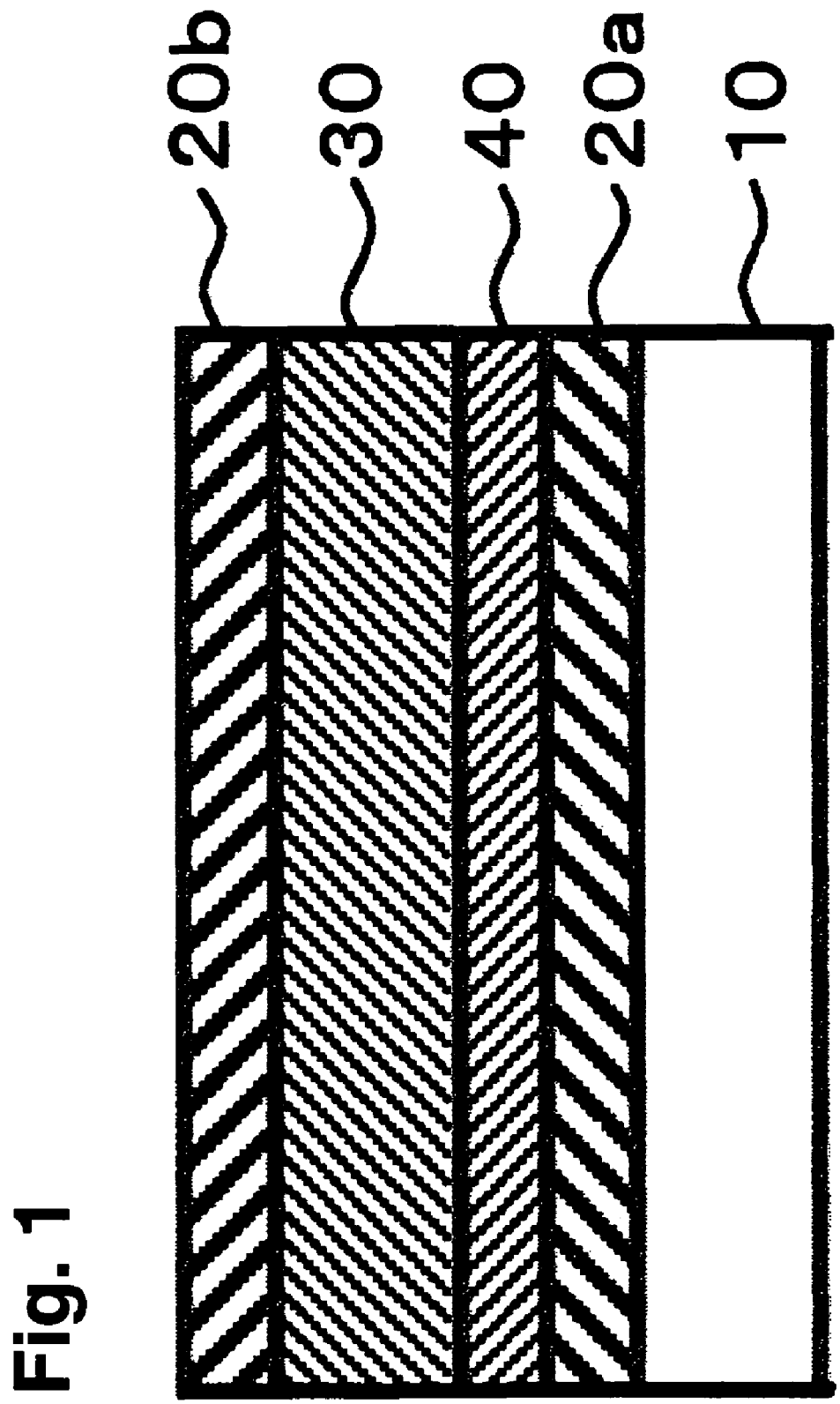
FIG. 1 is a schematic structural view showing an embodiment of the switching element of the present invention.

The present invention will be described below in detail with reference to drawings. FIG. 1 is a schematic structural view showing an embodiment of the switching element of the invention.

As shown in FIG. 1, the switching element has such a thin film layer structure that includes a first electrode layer 20a, a metal microparticle-containing layer 40, an organic bistable material layer 30, and a second electrode layer 20b are stacked in this order on a substrate 10.

The substrate 10 is not particularly limited. For example, a known glass substrate preferably is used as the substrate.

Materials of the first electrode layer 20a and the second electrode layer 20b are not particularly limited and may be appropriately selected from metal materials such as aluminum, gold, silver, nickel, and iron, inorganic materials such as indium tin oxide (ITO) and carbon, organic materials such as organic conjugated materials and liquid crystals, semiconductor materials such as silicon, etc.

For example, in a case where the quinomethane-based compound of the above structural formula (I) is used as the organic bistable compound for the organic bistable material layer 30 to be hereinafter described, it is preferred that the first electrode layer 20a adjacent to the metal microparticle-containing layer 40 is an aluminum electrode and the second electrode layer 20b adjacent to the organic bistable material layer 30 is a gold electrode. Aluminum has a lower absolute value of work function (WF) among electrode materials, and thus aluminum can release electrons easily. Gold has a higher absolute value of work function among electrode materials, and thus gold does not easily release electrons. Thus, the combination of aluminum and gold electrodes preferably are used to produce charge injection.

In the first and second electrode layers, the absolute value of the work function is the minimum energy required to remove an electron from a surface of a material. Therefore, the absolute value of the work function is a characteristic value specific to each electrode material. The work function can be measured from a photoelectric emission spectrum in the air. Electrode materials with low absolute values of work function other than aluminum include, for example, lithium, magnesium, calcium and silver. Materials with high absolute values of work function other than gold include, for example, chromium, platinum and ITO.

A method for forming the first electrode layer 20a and the second electrode layer 20b is not particularly limited, and known thin film forming methods, such as vacuum deposition, may be used. In the case of forming the thin film by vacuum deposition, the substrate temperature is preferably 0 to 150° C. in the deposition step, though it is appropriately selected depending on the electrode material. The thickness of each electrode layer is preferably 50 to 200 nm.

The organic bistable compound for the organic bistable material layer 30 has a functional group for transporting a charge, and preferably contains an electron-releasing functional group and an electron-accepting functional group in the molecule.

The electron-releasing functional groups include, but are not restricted to —$SCH_3$, —$OCH_3$, —$NH_2$, —$NHCH_3$ and —$N(CH_3)_2$. The electron-accepting functional groups include, but are not restricted to —CN, NO$_2$, —CHO, —COCH$_3$, —COOC$_2$H$_5$, —COOH, —Br, —Cl, —I, —OH, —F, =O.

Examples of the above described compound containing the electron-releasing functional group and the electron-accepting functional group in a molecule include, but are not particularly limited to organic bistable compounds such as aminoimidazole compounds, dicyano compounds, pyridone compounds, styryl compounds, stilbene compounds, quinomethane-based compounds, and butadiene compounds.

Preferred among the above organic bistable compounds is a quinomethane compound represented by the following structural formula (I).

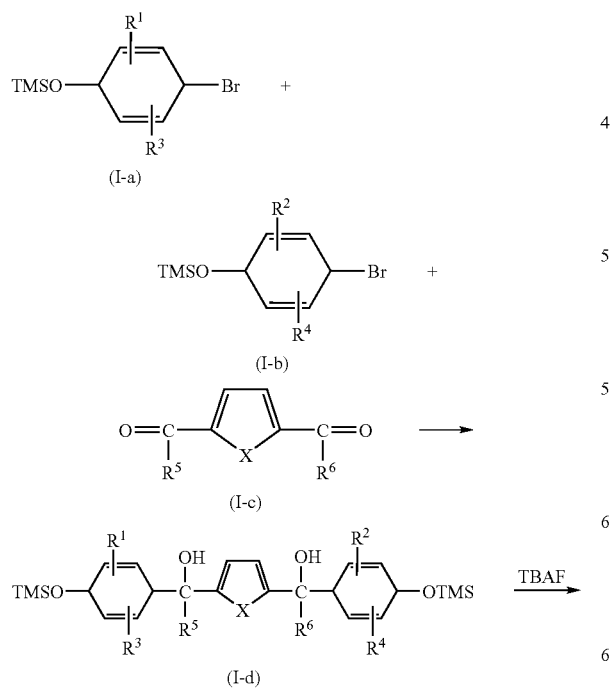

In the formula (I), R$^1$ to R$^4$ each represent a hydrogen atom, an alkyl group having 1 to 6 carbon atoms which may have a substituent, or an aryl group which may have a substituent, and R$^1$ to R$^4$ may be the same or may be different. R$^5$ and R$^6$ each represent a hydrogen atom, an alkyl group having 1 to 6 carbon atoms, which may have a substituent, an aryl group, which may have a substituent, or a heterocycle, which may have a substituent, and R$^5$ and R$^6$ may be the same or may be different. X represents oxygen or sulfur.

The quinomethane-based compound (I) can be synthesized according to e.g. the following reaction formula.

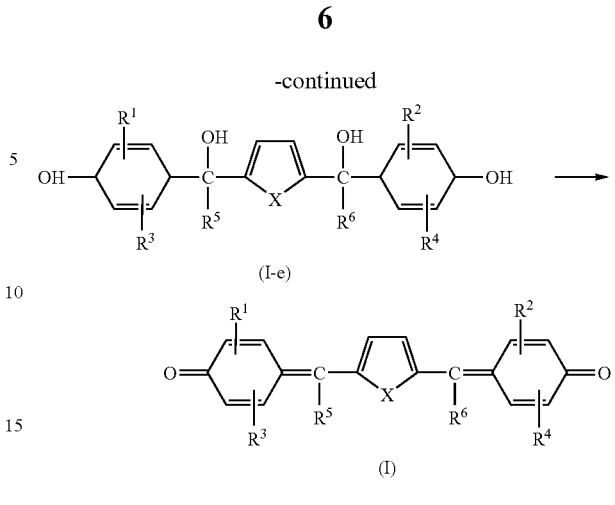

Thus, the quinomethane-based compound (I) can be obtained by the steps of reacting a compound (I-a), a compound (I-b), and a compound (I-c) in the presence of an appropriate organic metal catalyst such as n-butyllithium to obtain a compound (I-d), removing the protective groups of TMS (trimethylsilyl) to prepare a compound (I-e), and further subjecting the compound to dehydration condensation in the presence of a catalyst such as p-toluenesulfonic acid. TBAF in the reaction formula represents tetrabutylammonium fluoride. It should be noted that the above synthesizing method is described in detail in Japanese Patent Application Nos. 2002-27236 and 2002-35570, for example.

Specific examples of the quinomethane-based compounds include the compounds represented by the following structural formulae (I-1) to (I-18).

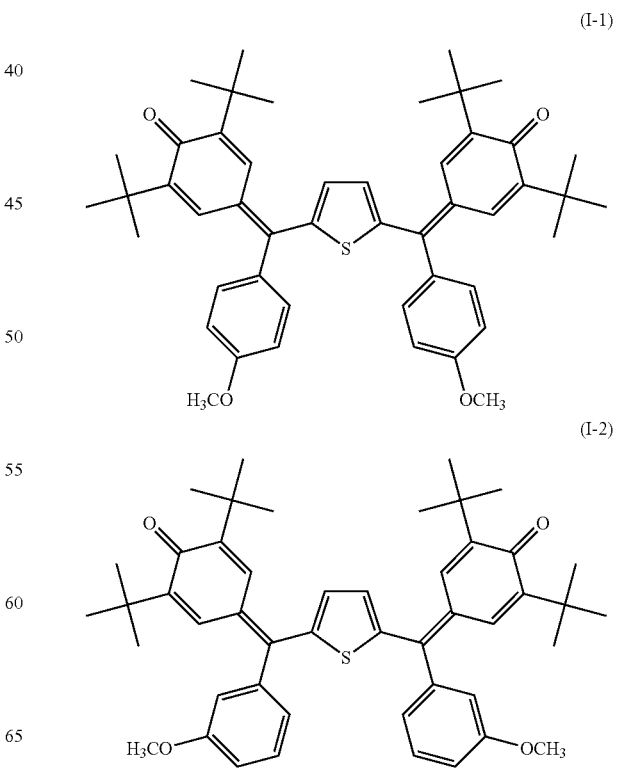

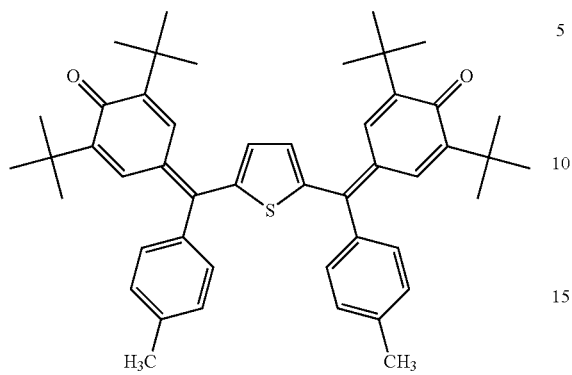
(I-3)
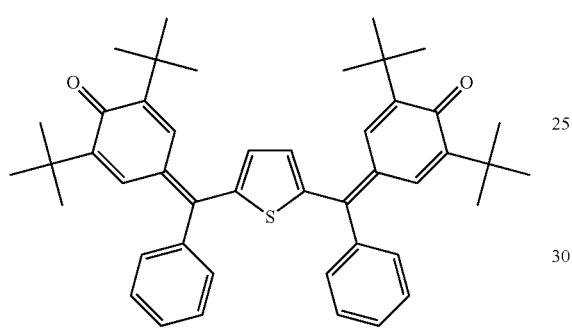
(I-4)
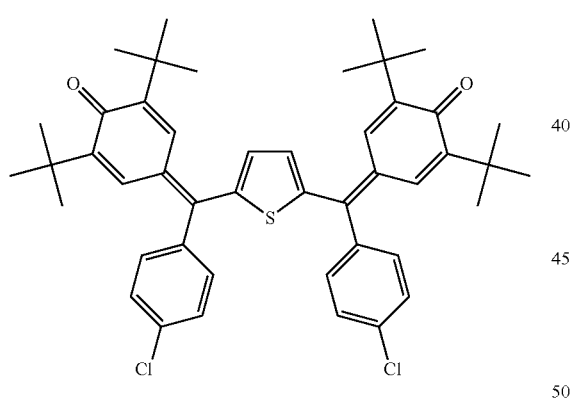
(I-5)
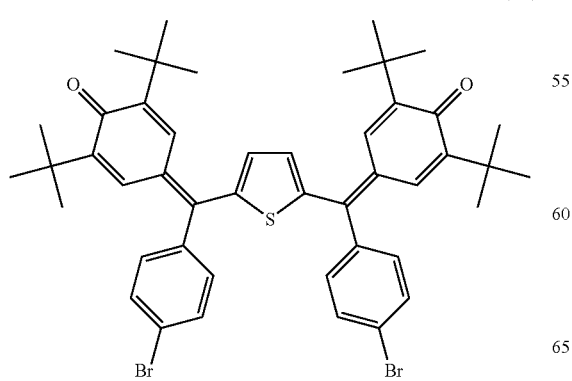
(I-6)
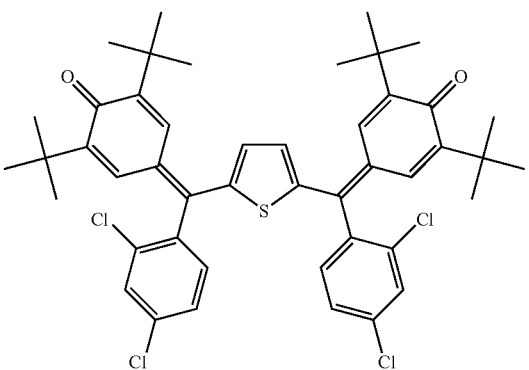
(I-7)
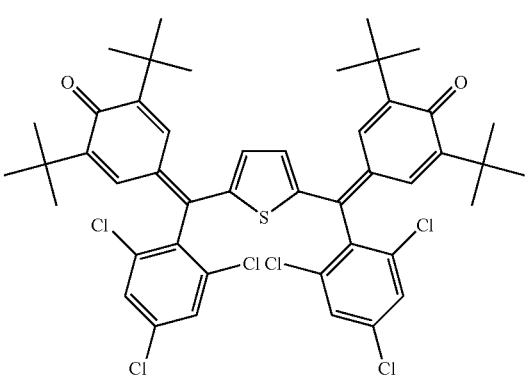
(I-8)
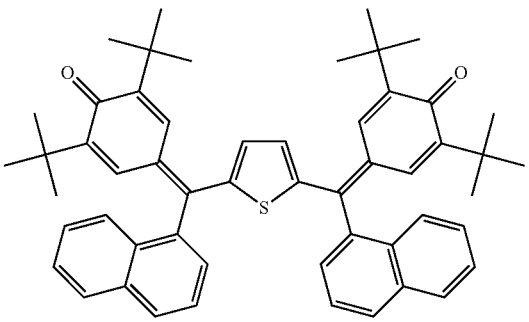
(I-9)
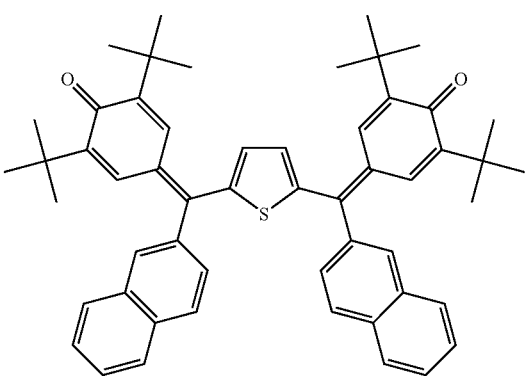
(I-10)

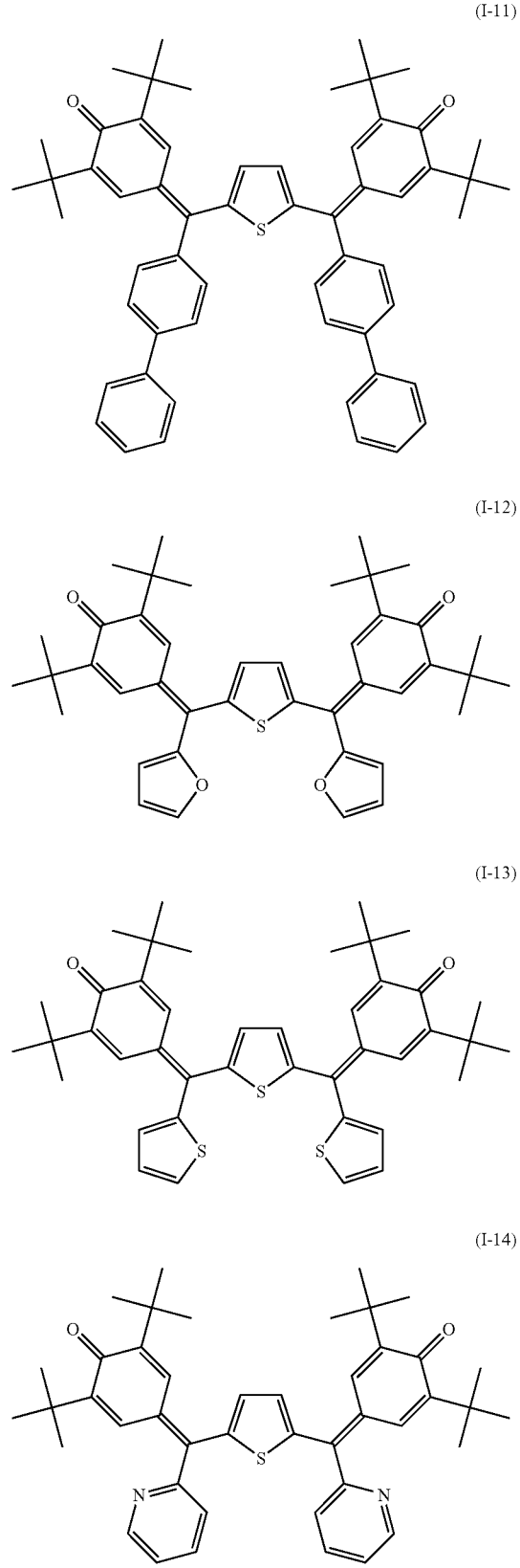
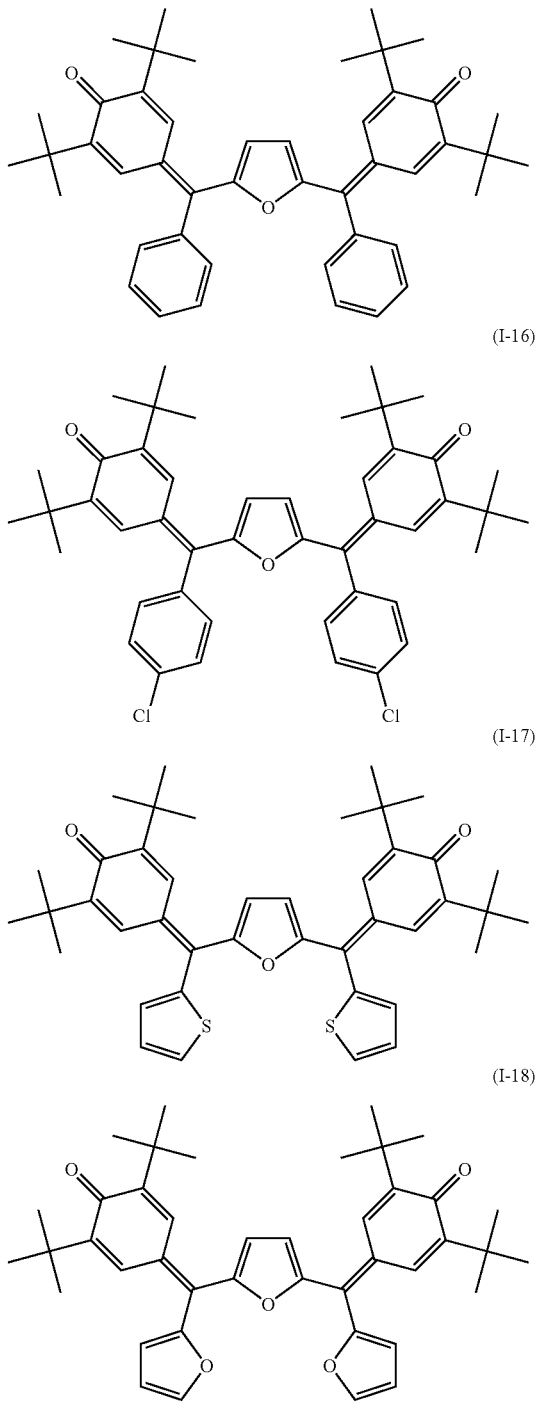

(In the compounds I-1 to I-18, the substituent of "+" represents a t-butyl group.)

The organic bistable material layer 30 may be formed by vacuum deposition, spin-coating, electrolytic polymerization, chemical vapor deposition (CVD), monomolecular film built-up (an LB method), a dip method, a bar coating method, an inkjet method, or screen printing, for example. However, the method of forming the organic bistable material layer 30 is not particularly restricted.

In the case of forming the organic bistable material layer 30 by vacuum deposition, the temperature of the substrate during the depositing step preferably 0 to 100° C., though it may be appropriately selected according to the organic bistable material. The thickness of the layer preferably is 20 to 150 nm.

In the case of forming the organic bistable material layer 30 by a coating method such as spin-coating, a solvent for the coating liquid may be a halogen solvent such as dichloromethane, dichloroethane, or chloroform, an ether solvent such as tetrahydrofuran (THF) or ethylene glycol dimethyl ether, an aromatic solvent such as toluene or xylene, an alcohol solvent such as ethyl alcohol, an ester solvent such as ethyl acetate or butyl acetate, a ketone solvent such as acetone or MEK, acetonitrile, etc. The organic bistable material, in an amount 0.001 to 30% by mass, is dissolved in the solvent, and a binder resin is added if necessary, to prepare the coating liquid. Examples of suitable binder resins include, for example, polycarbonates, polyesters, polyvinyl alcohols and polystyrenes. The conditions of the spin-coating may be controlled according to the desired thickness, and the rotation speed preferably is within the range of 200 to 3,600 rpm.

Next, the metal microparticle-containing layer 40 is described. A feature of the invention is that the metal microparticle-containing layer 40 containing the metal microparticles and the organic bistable compound is disposed between the first electrode layer 20a and the organic bistable material layer 30.

The metal microparticles are not particularly limited and may comprise any of various metal materials such as aluminum, gold, silver, copper, platinum, calcium, lithium, and rhodium. In the case of using the compound of the structural formula (I) as the organic bistable compound, the metal microparticles preferably comprise aluminum from the viewpoint of matching the energy levels.

Nano-size metal microparticles are available commercially from companies such as Tanaka Kikinzoku Kogyo K.K. Further, the metal microparticles can be formed by vacuum deposition, as described hereinafter.

The metal microparticle-containing layer 40 is preferably formed by codepositing the metal microparticles and the organic bistable compound, for example using vacuum deposition. In this case, the metal is evaporated, so that metal microparticles 5 to 20 nm in diameter can be obtained. By the codeposition process, a uniform hybrid thin film of the metal microparticles and the organic bistable compound can be obtained.

The codeposition process may be carried out by a known deposition apparatus in the same manner by which the organic bistable material layer 30 is formed. The substrate temperature in the process may be selected according to the organic material and is preferably in the range of 0 to 150° C. Further, the vacuum is preferably $10^{-5}$ torr or less. In the codeposition process, the volumetric ratio between the applied metal microparticles and the applied organic bistable material is preferably within the range of 10:1 to 1:20. Further, the thickness of the resulting metal microparticle-containing layer 40 is preferably 3 to 200 nm.

The metal microparticle-containing layer 40 also may be formed by a coating method such as spin-coating, under conditions equivalent to those of forming the organic bistable material layer 30. Particularly in the case of using a metal such as platinum or rhodium for the metal microparticle, the coating solvent is preferably an alcohol solvent such as ethyl alcohol, methyl alcohol, or propyl alcohol, a glycol solvent such as ethylene glycol, THF, ethylene glycol dimethyl ether, or pure water, since the material is easily dispersed in any of these solvents.

A percentage 0.001 to 30% by mass of the organic bistable material is dissolved in the coating solvent, and 0.001 to 30% by mass of the metal microparticles is dispersed therein. A binder resin is added if necessary to obtain a coating liquid. The binder resin may be, for example a polycarbonate, a polyester, a polyvinyl alcohol or a polystyrene. The spin-coating conditions may be appropriately selected according to the desired thickness, and the rotation speed preferably is within the range of 200 to 3,600 rpm. Further, the thickness of the resulting metal microparticle-containing layer 40 preferably is 3 to 200 nm.

In the switching element of the invention produced in the above manner, it is preferred that a charge is injected from the first electrode layer through the metal microparticle-containing layer to the organic bistable material layer. The energy barrier of the metal microparticle-containing layer to the first electrode layer should be lower than that of the organic bistable material layer to the first electrode layer.

Specifically, in a case where the charge is transported by electrons, it is preferred that the absolute value of work function $|WF_1|$ of the first electrode layer 20a, the absolute value of lowest unoccupied molecular orbital level $|LUMO_{OR}|$ of the organic bistable material layer 30, and the absolute value of lowest unoccupied molecular orbital level $|LUMO_{ME}|$ of the metal microparticle-containing layer 40 satisfy relationships defined by the following expressions (A) and (B).

$$|LUMO_{ME}| - |LUMO_{OR}| < |WF_1| - |LUMO_{OR'}| \quad (A)$$

$$|WF_1| - |LUMO_{ME}| < |WF_1| - |LUMO_{OR'}| \quad (B)$$

wherein $|LUMO_{OR'}|$ represents the absolute value of lowest unoccupied molecular orbital level of the organic bistable material layer in a case where the first electrode layer and the organic bistable material layer are stacked directly (one upon the another).

On the other hand, in a case where the charge is transported by holes, it is preferred that the absolute value of work function $|WF_1|$ of the first electrode layer 20a, the absolute value of highest occupied molecular orbital level $|HOMO_{OR}|$ of the organic bistable material layer 30, and the absolute value of highest occupied molecular orbital level $|HOMO_{ME}|$ of the metal microparticle-containing layer 40 satisfy the relationship defined by the following expressions (A') and (B').

$$|HOMO_{OR}| - |HOMO_{ME}| < |HOMO_{OR'}| - |WF_1| \quad (A')$$

$$|HOMO_{ME}| - |WF_1| < |HOMO_{OR'}| - |WF_1| \quad (B')$$

wherein $|HOMO_{OR'}|$ represents the absolute value of highest occupied molecular orbital level of the organic bistable material layer in a case where the first electrode layer and the organic bistable material layer are stacked directly (one on another).

The absolute value of work function $|WF_1|$ of the first electrode layer 20a can be measured from a photo electric emission spectrum in the air.

The values of $|LUMO_{OR}|$, $|LUMO_{ME}|$, $|LUMO_{OR'}|$, $|HOMO_{OR}|$, $|HOMO_{ME}|$, and $|HOMO_{OR'}|$ can be measured by calculating electron affinities from ionization potentials obtained by photoelectric emission spectra in the air and band gaps obtained by optical absorption spectra, and by correcting the electron affinities for vacuum level shifts of the layers obtained by the Kelvin method, for example.

In the above switching element, the mechanism of the high transition probability is not entirely known, and is presumed to be as follows.

In general, with respect to energy levels of metal microparticles, the ionization potentials and the electron affinities of single atoms are known (see, e.g. *Kagaku Binran Kisohen II*, edited by The Chemical Society of Japan, Maruzen, 1994).

Further, in clusters comprising aggregated atoms, the energy levels gradually approach the bulk work functions (WF) as the number of the aggregated atoms is increased. Thus, with D (measured in nanometers) representing a cluster diameter of a metal, the following equations are approximately satisfied (see *Atarashii Kurasuta no kagaku* (*New-Cluster Science*), edited by Satoru Sugano, Kodansha Ltd., 2002).

IP (Ionization Potential) (eV)=$WF-1.04/D$

EA (Electron Affinity) (eV)=$WF+1.80/D$

By adding the metal microparticles to the organic bistable material, the energy barrier to the charge injection from the first electrode 20a to the metal microparticle dispersion layer 40 is lowered due to the effect of the metal microparticles. It is presumed that the interference produced by the energy barrier with the charge injection thus is removed, and the transition probability can be increased by the removal and also by the electrostatic focusing effect of the metal microparticles.

Thus, it is considered that the metal microparticles are dispersed to utilize the electric properties in addition to the uneven transition voltage-preventing effect of the electrostatic focusing caused by the roughness of the microparticles, whereby the transition probability can be increased by the shift of Fermi levels.

EXAMPLES

The switching element of the invention will be described in further detail below with reference to Examples.

Example 1

A switching element having a structure shown in FIG. 1 was produced in the following manner. A glass substrate was used as a substrate 10, and thin films of a first electrode layer 20a, a metal microparticle-containing layer 40, an organic bistable material layer 30, and a second electrode layer 20b were formed in this order by vacuum deposition, to obtain the switching element of Example 1.

As deposition sources, aluminum was used for the first electrode layer 20a, gold was used for the second electrode layer 20b, and the quinomethane compound represented by the following structural formula (I-1) was used for the organic bistable material layer 30. The metal microparticle-containing layer 40 was formed by codepositing aluminum and a quinomethane compound represented by the structural formula (I-1) at a volume ratio of 3:1.

The deposition steps were carried out by resistance heating using a diffusion pump exhaust apparatus at a vacuum of $3\times10^{-6}$ torr.

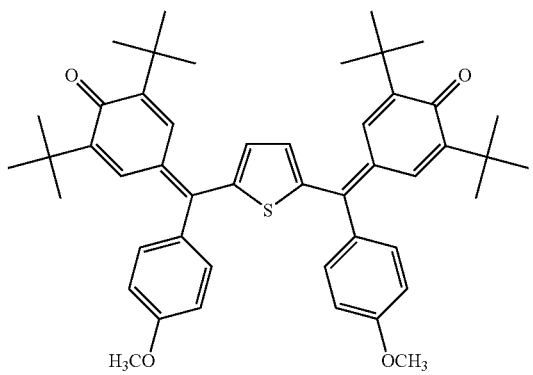

(I-1)

Example 2

A switching element of Example 2 was produced in the same manner as Example 1 except that the metal microparticle-containing layer 40 had a thickness of 15 nm.

Example 3

A switching element of Example 3 was produced in the same manner as the switching element of Example 1, except that the compound of the following structural formula (I-5) was used as a quinomethane-based compound, and the thicknesses of the first electrode layer 20a, the metal microparticle-containing layer 40, the organic bistable material layer 30, and the second electrode layer 20b were 100 nm, 20 nm, 60 nm, and 100 nm, respectively.

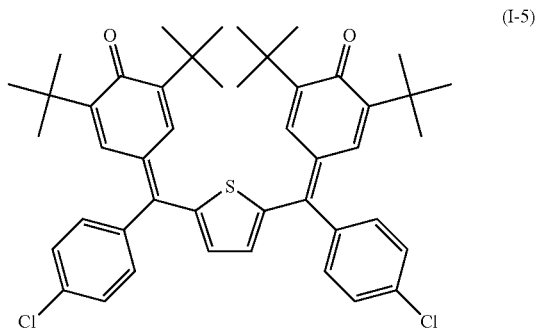

(I-5)

Example 4

A switching element of Example 4 was produced in the same manner as the switching element of Example 1, except that the compound of the following structural formula (I-6) was used as a quinomethane-based compound, and the thicknesses of the first electrode layer 20a, the metal microparticle-containing layer 40, the organic bistable material layer 30, and the second electrode layer 20b were 100 nm, 30 nm, 80 nm, and 100 nm, respectively.

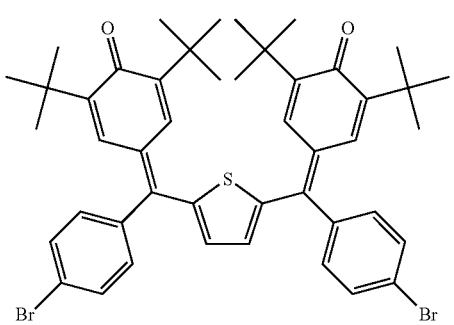

(I-6)

Comparative Example 1

A switching element of Comparative Example 1 was produced in the same manner as the switching element of Example 1 except that the metal microparticle-containing layer 40 was not formed, and the first electrode layer 20a, the organic bistable material layer 30, and the second electrode layer 20b were formed in the stated order.

Comparative Example 2

A switching element of Comparative Example 2 was produced in the same manner as the switching element of Example 3, except that the metal microparticle-containing layer 40 was not formed, and the first electrode layer 20a, the organic bistable material layer 30, and the second electrode layer 20b were formed in this order.

Experimental Example 1

The energy levels (measured in units of electron-volts (eV)) of the switching elements of Example 1 and Comparative Example 1 were measured. The results are shown in Table 1 and FIGS. 2 and 3. WF (the absolute value of work function) and the lowest unoccupied molecular orbital level (the LUMO level) of each layer were measured by an atmospheric photoelectric emission spectrum method using model AC-1 manufactured by Riken Keiki Co., Ltd. and a Kelvin method using model FAC-1 manufactured by Riken Keiki Co., Ltd.

TABLE 1

| | First electrode layer 20a | Metal microparticle-containing layer 40 | | Organic bistable material layer 30 | |
|---|---|---|---|---|---|
| Example 1 | $|WF_1|$ 4.20 eV | $|LUMO_{ME}|$ 4.63 eV | $|HOMO_{ME}|$ 6.58 eV | $|LUMO_{OR}|$ 4.35 eV | $|HOMO_{OR}|$ 6.30 eV |
| Comparative Example 1 | $|WF_1|$ 4.20 eV | $|LUMO_{ME}|$ — | $|HOMO_{ME}|$ — | $|LUMO_{OR'}|$ 3.28 eV | $|HOMO_{OR'}|$ 5.23 eV |

Figure 2:
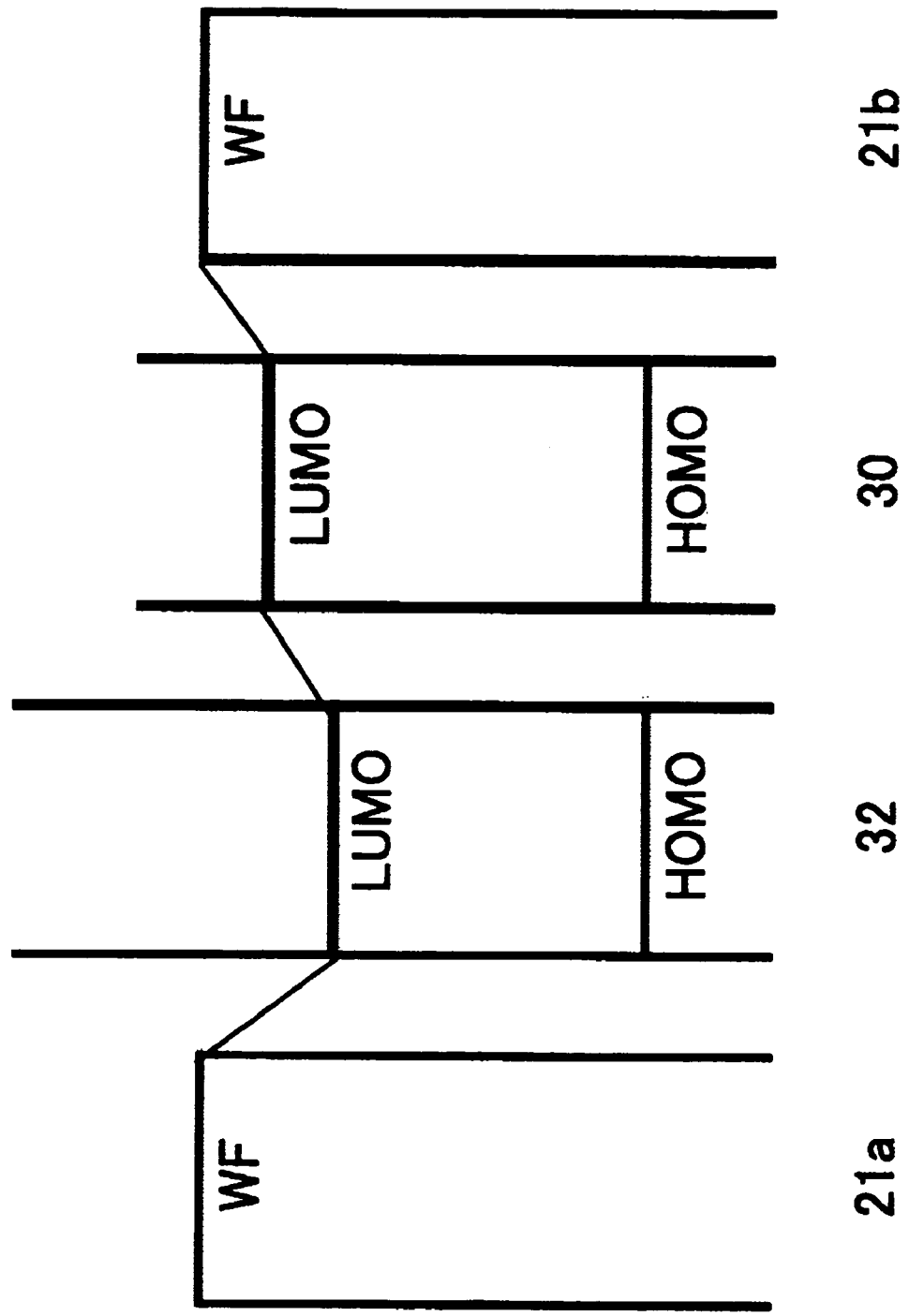
FIG. 2 is a view showing an energy level of the switching element of Example 1.

In the metal microparticle-containing layer 40 of Example 1 of Table 1 and FIG. 2, the LUMO level, which was an energy level of the electron conduction band of the organic material, was lowered by dispersion of the aluminum microparticles. It is presumed that, for example, a donor impurity (a electron-releasing impurity) is introduced near the electron affinity level, and the Fermi level is shifted to the electron affinity level and corresponds to that of the adjacent layer, whereby the energy level is lowered. Thus, it is considered that the aluminum microparticles acted as the donor impurity (the electron-releasing impurity) for the organic bistable material layer 30 to lower the LUMO level.

Thus, in the switching element of Example 1, in which the quinomethane compound (I-1) was an electron-transporting compound, the first electrode 20a acted as a ground, and the second electrode 20b acted as a positive bias, electrons were injected from the first electrode 20a through the metal microparticle-containing layer 40 to the organic bistable material layer 30, to obtain the bistable characteristics.

Figure 3:
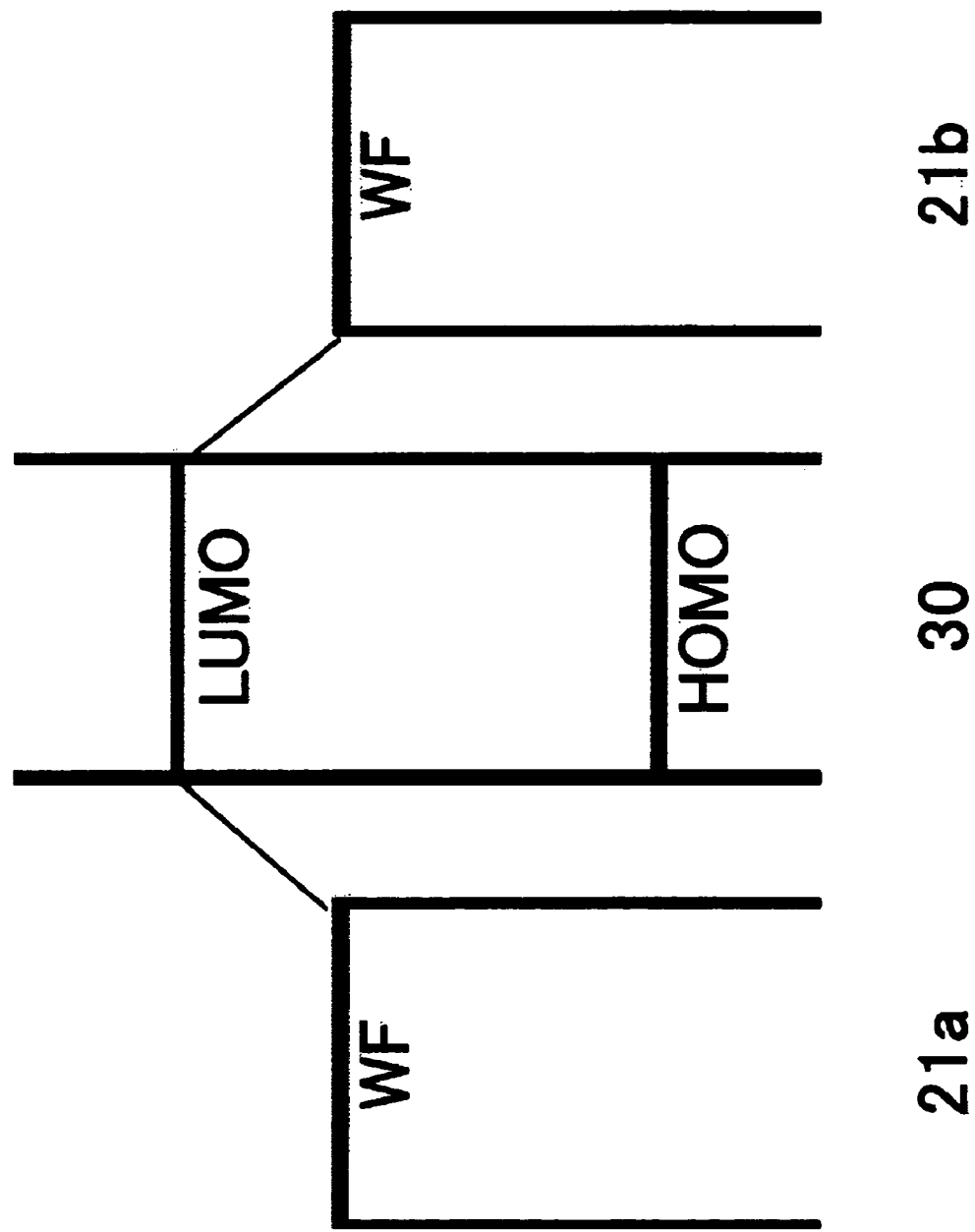
FIG. 3 is a view showing an energy level of the switching element of Comparative Example 1.

Further, the energy barrier of the metal microparticle-containing layer 40 to the organic bistable material layer 30 of FIG. 2 was lower than that of the electrode 21a to the organic bistable material layer 30 of FIG. 3. It is considered that the result was obtained because the metal microparticle-containing layer 40 contained the same organic bistable material as the organic bistable material layer 30.

On the other hand, as shown in FIG. 3, in Comparative Example 1 the energy level (the LUMO level) of the organic bistable material layer 30 was higher than that of the first electrode 20a, whereby electrons were not easily injected into the organic bistable material layer 30.

Experimental Example 2

Figure 4:
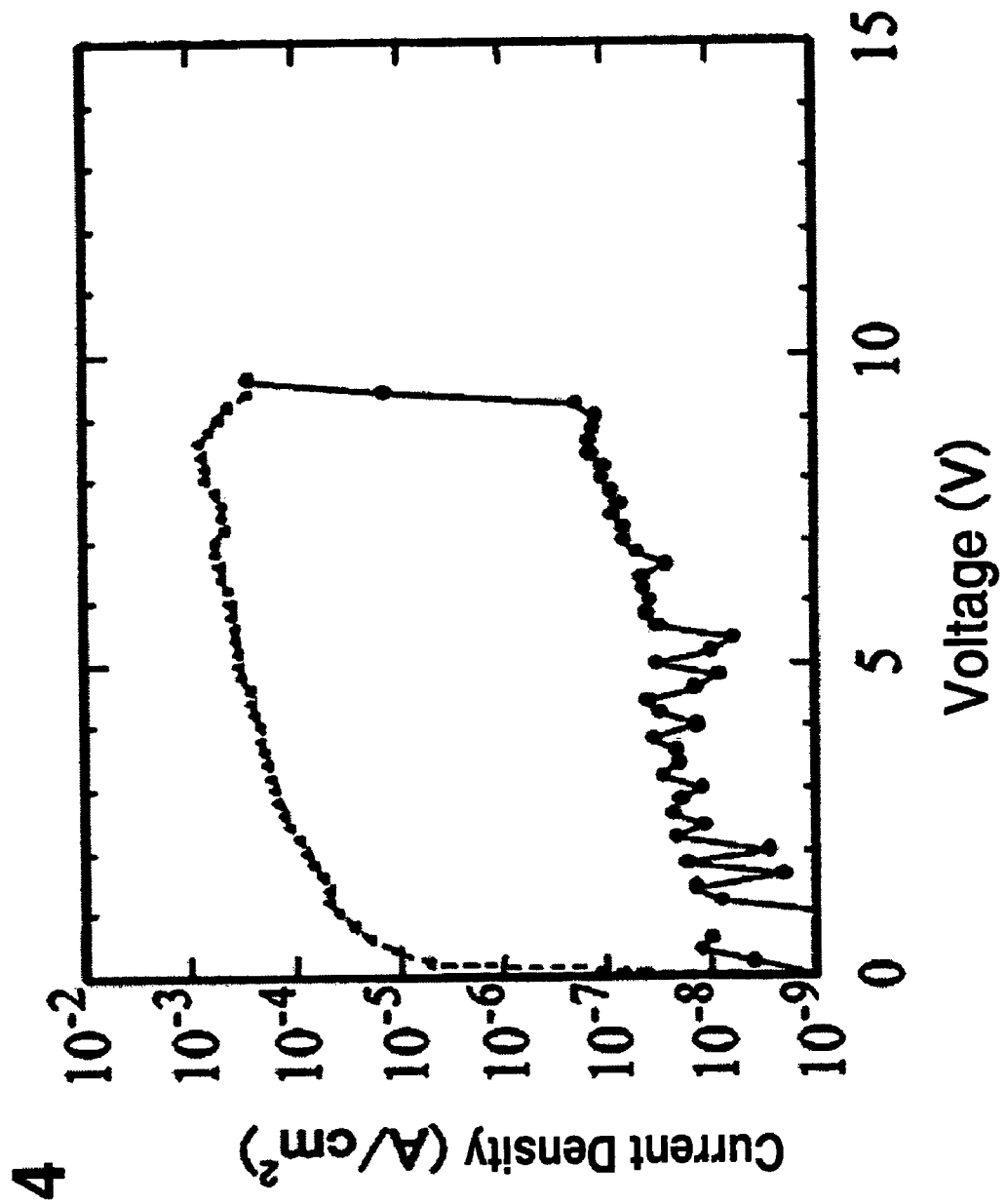
FIG. 4 is a view showing a current-voltage characteristic of the switching element of Example 1.
Figure 5:
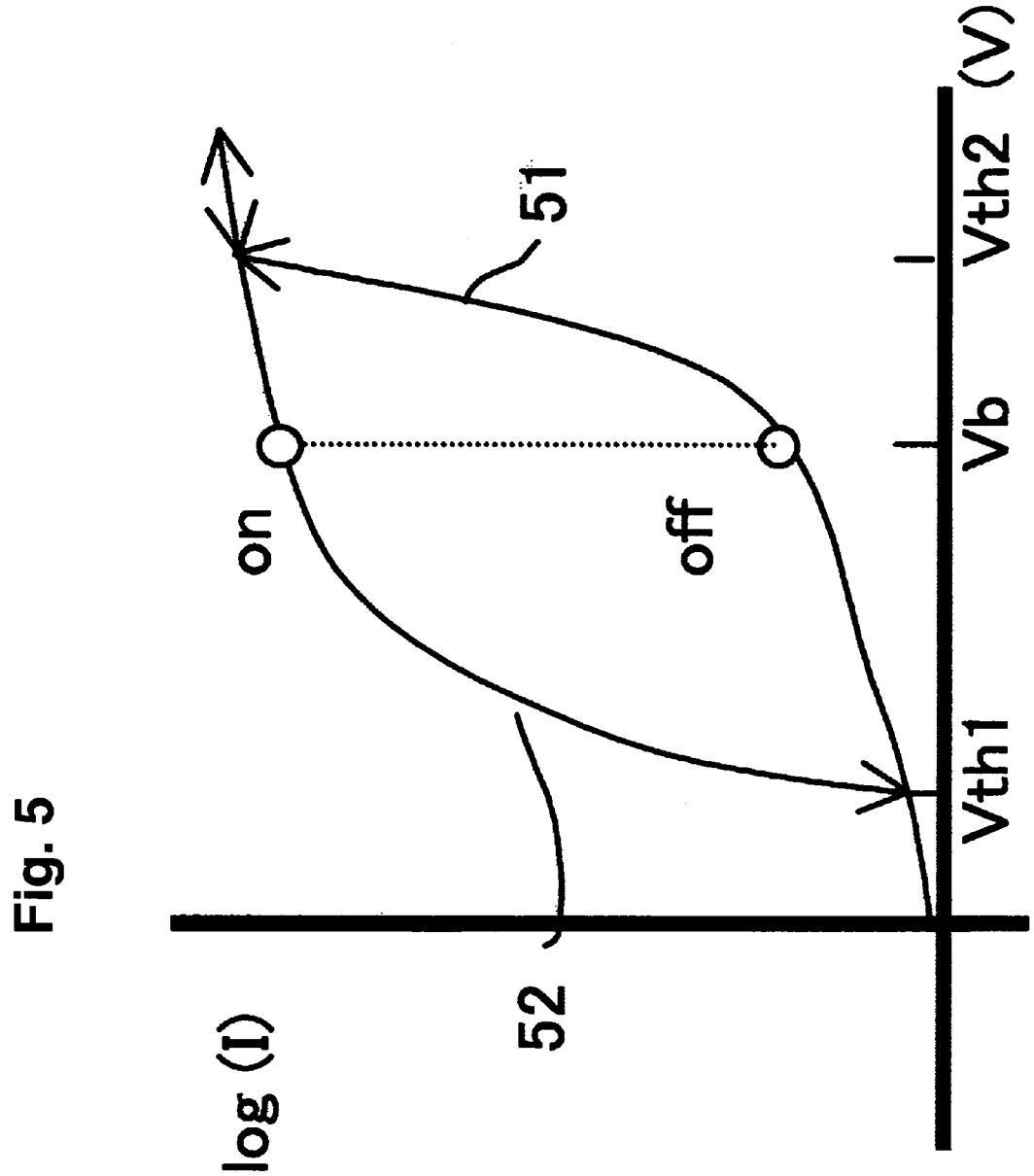
FIG. 5 is a view schematically showing a current-voltage characteristic of conventional switching elements.

The current-voltage characteristics of 50 switching elements according to each of Examples 1 to 4 and Comparative Examples 1 and 2 were measured at the room temperature while using the first electrode 20a as a ground and using the second electrode 20b as a positive bias, to obtain the transition probability and Vth2 of the threshold voltage shown in FIG. 5. The results are shown in Table 1. Further, a current-voltage characteristic of the switching element according to Example 1 is shown in FIG. 4.

TABLE 2

| | Transition probability (%) | Vth2 (average value) |
|---|---|---|
| Example 1 | 98 | 7.8 |
| Example 2 | 96 | 9.6 |
| Example 3 | 100 | 8.6 |
| Example 4 | 98 | 8.4 |
| Comparative Example 1 | 64 | 7.8 |
| Comparative Example 2 | 54 | 8.4 |

It is clear from the results shown in Table 2 that the transition probabilities of the Examples of the invention were remarkably increased as compared with the Comparative Examples. Further, as shown in FIG. 4, the element of Example 1 exhibited a low resistance state/high resistance state ratio of about 1,000 or more, which is an excellent bistable characteristic.

INDUSTRIAL APPLICABILITY

The switching element of the present invention can be suitably used for driving display panels using organic EL elements, liquid crystals, etc., or for high-density memories, etc.

The invention claimed is:

1. A switching element including an organic bistable material layer between at least two electrodes, the organic bistable material layer containing an organic bistable compound having two stable resistance values to an applied voltage, the switching element, comprising thin films of, in the order recited:
   a first electrode layer;
   a metal microparticle-containing layer containing metal microparticles and the organic bistable compound;
   the organic bistable material layer containing the organic bistable material; and
   a second electrode layer,
   wherein the organic bistable compound is represented by structural formula (I):

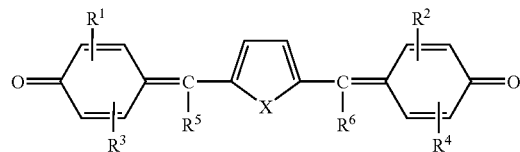

(I)

wherein $R^1$ to $R^4$ each represent a hydrogen atom an alkyl group having 1 to 6 carbon atoms which may have a substituent, or an aryl group which may have a substituent, $R^1$ to $R^4$ may be the same or different, $R^5$ and $R^6$ each represent a hydrogen atom, an alkyl group having 1 to 6 carbon atoms which may have a substituent, an aryl group which may have a substituent, or a heterocycle which may have a substituent, $R^5$ and $R^6$ may be the same or different, and X represents oxygen or sulfur.

2. The switching element according to claim 1, wherein a charge is injected from the first electrode layer through the metal microparticle-containing layer to the organic bistable material layer, and wherein the metal microparticle-containing layer has an energy barrier to the first electrode layer that is lower than that of the organic bistable material layer.

3. The switching element according to claim 1, wherein the metal microparticle-containing layer is formed by codepositing a metal and the organic bistable compound.

4. The switching element according to claim 1, wherein the metal microparticle-containing layer is formed by applying a solution containing the metal microparticles and the organic bistable compound.

5. The switching element according to claim 1, wherein the first electrode layer comprises aluminum and the second electrode layer comprises gold.

6. The switching element according to claim 1, wherein the metal microparticles include aluminum.

7. A switching element, comprising:
   a first electrode layer;
   a metal microparticle-containing layer;
   an organic bistable material layer, the organic bistable material layer containing an organic bistable compound having two stable resistance values to an applied voltage; and
   a second electrode layer,
   wherein the first electrode layer, the metal microparticle-containing layer, the organic bistable material layer and the second electrode layer are thin films formed in this order, and
   wherein the metal microparticle-containing layer contains both metal microparticles and the organic bistable compound, and
   wherein the organic bistable compound is represented by structural formula (I):

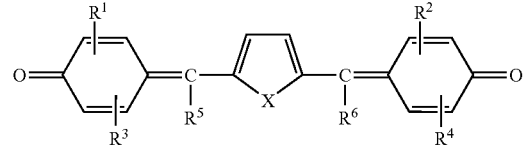

(I)

wherein $R^1$ to $R^4$ each represent a hydrogen atom, an alkyl group having 1 to 6 carbon atoms which may have a substituent, or an aryl group which may have a substituent, $R^1$ to $R^4$ may be the same or different, $R^5$ and $R^6$ each represent a hydrogen atom, an alkyl group having 1 to 6 carbon atoms which may have a substituent, an aryl group which may have a substituent or a heterocycle which may have a substituent, $R^5$ and $R^6$ may be the same or different, and X represents oxygen or sulfur.

8. The switching element according to claim 7, wherein the metal microparticle-containing layer has an energy barrier to the first electrode layer that is lower than that of the organic bistable material layer, and wherein the energy barrier is formed by injection of a charge from the first electrode layer through the metal microparticle-containing layer to the organic bistable material layer.

9. The switching element according to claim 7, wherein the first electrode layer comprises aluminum and the second electrode layer comprises gold.

10. The switching element according to claim 9, wherein the metal microparticles comprise aluminum.

11. The switching element according to claim 7, wherein the metal microparticles comprise aluminum.

12. A method of forming a switching element, comprising the steps of:
   forming a first electrode layer;
   forming a metal microparticle-containing layer on the first electrode layer to contain both metal microparticles and an organic bistable compound having two stable resistance values to an applied voltage;
   forming an organic bistable material layer on the metal microparticle-containing layer, the organic bistable material layer containing the organic bistable compound; and
   forming a second electrode layer on the organic bistable material layer, whereby the first electrode layer, the metal microparticle-containing layer, the organic bistable material layer and the second electrode layer are thin films stacked in this order,
   wherein the organic bistable compound is represented by structural formula (I):

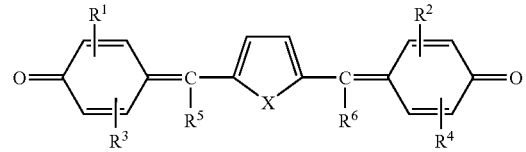

(I)

wherein $R^1$ to $R^4$ each represent a hydrogen atom, an alkyl group having 1 to 6 carbon atoms which may have a substituent, or an aryl group which may have a substituent, $R^1$ to $R^4$ may be the same or different, $R^5$ and $R^6$ each represent a hydrogen atom, an alkyl group having 1 to 6 carbon atoms which may have a substituent, an aryl group which may have a substituent, or a heterocycle which may have a substituent, $R^5$ and $R^6$ may be the same or different, and X represents oxygen or sulfur.

13. The method according to claim 12, wherein the step of forming the metal microparticle-containing layer includes codepositing a metal and the organic bistable compound.

14. The method according to claim 12, wherein the step of forming the metal microparticle-containing layer includes applying a solution containing the metal microparticles and the organic bistable compound.

15. The switching element according to claim 5, wherein the metal microparticles include aluminum.

* * * * *